United States Patent
Pernot et al.

(10) Patent No.: US 12,402,438 B2
(45) Date of Patent: Aug. 26, 2025

(54) OPTOELECTRONIC DEVICE, SINGLE-PHOTON GENERATOR, MEMORY, MULTIPLEXER, IMPLANT AND ASSOCIATED METHODS

(71) Applicants: INSTITUT NATIONAL DE LA SANTE ET DE LA RECHERCHE MEDICALE (INSERM), Paris (FR); UNIVERSITE GRENOBLE ALPES, Saint Martin d'Heres (FR); INSTITUT POLYTECHNIQUE DE GRENOBLE, Grenoble (FR); UNIVERSITE PAUL SABATIER TOULOUSE, III, Toulouse (FR); INSTITUT NATIONAL POLYTECHNIQUE DE TOULOUSE, Toulouse (FR); CENTRE NATIONAL DE LA RECHERCHE SCIENTIFIQUE, Paris (FR)

(72) Inventors: Julien Pernot, Grenoble (FR); Cedric Masante, Fontaine (FR); Nicolas Rouger, Toulouse (FR); Martin Kah, Fontaine (FR); Clement Hebert, Fontaine (FR)

(73) Assignees: INSTITUT NATIONAL DE LA SANTE ET DE LA RECHERCHE MEDICALE (INSERM), Paris (FR); UNIVERSITE GRENOBLE ALPES, Saint Martin d'Heres (FR); INSTITUT POLYTECHNIQUE DE GRENOBLE, Grenoble (FR); UNIVERSITE PAUL SABATIER TOULOUSE III, Toulouse (FR); INSTITUT NATIONAL POLYTECHNIQUE DE TOULOUSE, Toulouse (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 137 days.

(21) Appl. No.: 18/562,207

(22) PCT Filed: May 18, 2022

(86) PCT No.: PCT/EP2022/063421
§ 371 (c)(1),
(2) Date: Nov. 17, 2023

(87) PCT Pub. No.: WO2022/243364
PCT Pub. Date: Nov. 24, 2022

(65) Prior Publication Data
US 2024/0243218 A1    Jul. 18, 2024

(30) Foreign Application Priority Data
May 18, 2021  (FR) ........................... 2105172

(51) Int. Cl.
*H10H 20/00* (2025.01)
*H10H 20/826* (2025.01)

(52) U.S. Cl.
CPC ...... *H10H 20/062* (2025.01); *H10H 20/8262* (2025.01)

(58) Field of Classification Search
CPC .......................... H10H 20/062; H10H 20/8262
See application file for complete search history.

(56) References Cited

U.S. PATENT DOCUMENTS

| | | |
|---|---|---|
| 2012/0235738 A1 | 9/2012 | Masuda et al. |
| 2013/0069093 A1* | 3/2013 | Liu .................... H10H 20/8506 257/E33.061 |

(Continued)

FOREIGN PATENT DOCUMENTS

| | | | | |
|---|---|---|---|---|
| CN | 109119410 B | * | 4/2020 | ........... H01L 21/561 |
| CN | 117008252 A | * | 11/2023 | |

(Continued)

OTHER PUBLICATIONS

Kalish, Rafi, "Review Article; Diamond as a unique high-tech electronic material: difficulties and prospects," Journal of Physics D: Applied Physics, Institute of Physics Publishing, Bristol, GB, vol. 40, No. 20, Oct. 21, 2007, pp. 6467-6478.

(Continued)

*Primary Examiner* — Adam D Houston
(74) *Attorney, Agent, or Firm* — HAUPTMAN HAM, LLP

(57) ABSTRACT

A device including a first portion, a second portion, a first contact and a second contact, the first portion being made of a semiconductor having a first doping, the second portion (Continued)

being made of a semiconductor having a second doping different than the first, the first portion and the second portion forming a p/n junction including a depletion zone in the first portion, the contacts being configured so that when an electric voltage (V1) is applied between the contacts, a dimension of the depletion zone depends on a value of the electric voltage, an ionization energy being defined for dopants of the second portion. The device includes an emitter generating a radiation having an energy greater than the ionization energy and illuminating the second portion with the radiation.

15 Claims, 3 Drawing Sheets

(56) References Cited

U.S. PATENT DOCUMENTS

| | | | |
|---|---|---|---|
| 2017/0133356 A1* | 5/2017 | Mercier | H10H 20/813 |
| 2018/0197997 A1 | 7/2018 | Ito et al. | |
| 2018/0235545 A1 | 8/2018 | Barakat et al. | |
| 2022/0020698 A1* | 1/2022 | Kim | H01L 23/552 |
| 2022/0045010 A1* | 2/2022 | Shin | H01L 24/48 |
| 2022/0246770 A1* | 8/2022 | Rascuna' | H10D 8/051 |
| 2024/0304511 A1* | 9/2024 | Chen | H01L 21/6835 |
| 2025/0107291 A1* | 3/2025 | Lai | H10H 20/01 |

FOREIGN PATENT DOCUMENTS

| | | | | |
|---|---|---|---|---|
| JP | 2008198731 A | | 8/2008 | |
| KR | 102800286 B1 | * | 4/2025 | |
| WO | WO-2021022376 A1 | * | 2/2021 | G06N 10/00 |
| WO | WO-2022243364 A1 | * | 11/2022 | H01L 25/167 |
| WO | WO-2023148107 A1 | * | 8/2023 | H01L 25/0753 |
| WO | WO-2023180369 A1 | * | 9/2023 | H01L 25/0756 |

OTHER PUBLICATIONS

International Search Report and Written Opinion issued in corresponding International Application No. PCT/EP2022/063421, dated Sep. 12, 2022, pp. 1-11, European Patent Office, Rijswijk, Netherlands.

* cited by examiner

OPTOELECTRONIC DEVICE, SINGLE-PHOTON GENERATOR, MEMORY, MULTIPLEXER, IMPLANT AND ASSOCIATED METHODS

The present application is a U.S. National Phase of International Application Number PCT/EP2022/063421, filed May 18, 2022, which claims priority to French Application No. 2105172, filed May 18, 2021.

DOMAIN OF THE INVENTION

The present invention relates to an optoelectronic device. The present invention also relates to a single-photon generator, a memory, a multiplexer, an implant and a method implementing such an optoelectronic device.

Technological Background

Electronic devices including at least one portion of a semiconductor material, the properties of which are controlled by an electric voltage applied between two contacts are used in numerous applications.

For example, transistors use a junction between two doped semiconductor portions having different types of doping, the voltage between the two contacts modifying the extension of a depletion zone of the junction in at least one of the two portions. In particular, the use of a voltage having a given value can cause the extension of the depletion zone in a significant fraction of one of the portions.

Since the depletion zone is a zone in which no free carrier, or very few free carriers, is (are) present, a large extension of the depletion zone can block, in certain cases, all electric conduction between two electric pads connected to one of the portions, whereas for other values of the voltage a conductive channel exists between these two pads.

Thus, such devices can quickly switch between their two states according to whether a voltage is applied between their contacts, and according to the value of this voltage, and are called "junction field effect transistors" or "JFETs". Other types of devices using the same type of controls, for example MOSFET transistors, or single-photon emitters (inter alia), advantageously take advantage of this type of control to switch in a simple and fast manner.

However, these devices require a non-negligible quantity of energy to remain in that of their states that requires the application of a voltage, for the very reason that this voltage must be applied permanently. Their energy consumption can thus be high because of this volatile nature, in particular in the case of maintaining a given state for a long period.

There is therefore a need for an optoelectronic device having a lower energy consumption than the devices of the prior art in the case of maintaining a given state for a long period.

SUMMARY

For this purpose, an optoelectronic device is proposed including a first portion, a second portion, a first contact and a second contact, the first portion being made of a first semiconductor material having a first type of doping out of n-type doping and p-type doping, the second portion being made of a second semiconductor material having a second type of doping out of n-type doping and p-type doping, the second type of doping being different than the first type of doping, the first portion and the second portion being in contact with one another and forming a p/n junction including a depletion zone in the first portion, the first contact being electrically connected to the first portion, the second contact being electrically connected to the second portion, the first contact and the second contact being configured so that, when an electric voltage is applied between the first contact and the second contact, a dimension of the depletion zone depends on a value of the electric voltage, an ionization energy being defined for dopants of the second portion, the ionization energy being a difference in energy between an energy level of the dopants and an energy level of the conduction band for a material of the n type and being a difference in energy between an energy level of the valence band and an energy level of the dopants for a material of the p type, the optoelectronic device further includes an emitter configured to generate an electromagnetic radiation having a photon energy greater than or equal to the ionization energy of the dopants of the second portion and to illuminate the second portion with the radiation.

According to advantageous but non-obligatory embodiments, the device has one or more of the following features, taken alone or according to all the technically possible combinations:

- the photon energy is strictly less than a band gap value of the second portion, the band gap value being a difference in energy between a conduction band and a valence band of the second portion.
- the device further includes a thermoregulator configured to maintain a temperature of the second portion at a value such that the thermal energy of the carriers in the second portion is less than or equal to one tenth of the ionization energy.
- the device further includes a controller configured to control the generation of the radiation by the emitter and to modify a value of voltage between the first contact and the second contact while the second portion is illuminated with the radiation.
- the optoelectronic device is a transistor and further includes a third electric contact, the third electric contact being electrically connected to the first portion, the first contact being a source, the second contact being a gate and the third contact being a drain of the transistor, the first contact and the second contact being configured so that for a given value of the voltage between the first contact and the second contact, the depletion zone prevents the passage of charge carriers, in the first portion, between the first contact and the third contact.
- the ionization energy is greater than or equal to 0.4 electronvolts, particularly greater than or equal to 1 electronvolt, in particular greater than or equal to 1.5 electronvolts.
- the second material is diamond.
- the device includes at least one NV center in the first portion, the first contact and the second contact being configured so that for a first value of the voltage between the first contact and the second contact, the depletion zone includes the NV center and for a second value of the voltage, the depletion zone does not include the NV center.

A single-photon generator including an optoelectronic device as described above is also proposed.

A memory including at least one transistor as described above is also proposed, the memory being configured to store at least one piece of information in the form of an on or off state of the transistor.

A time multiplexer including at least one transistor as described above is also proposed.

An implant suitable for being implanted in a human or animal body, including a multiplexer as described above and/or at least one transistor as described above, is also proposed.

A method for operating an optoelectronic device including a first portion, a second portion, a first contact and a second contact is also proposed, the first portion being made of a first semiconductor material having a first type of doping out of n-type doping and p-type doping, the second portion being made of a second semiconductor material having a second type of doping out of n-type doping and p-type doping, the second type of doping being different than the first type of doping, the first portion and the second portion being in contact with one another and forming a p/n junction including a depletion zone in the first portion, the first contact being electrically connected to the first portion, the second contact being electrically connected to the second portion,

- an ionization energy being defined for dopants of the second portion, the ionization energy being a difference in energy between an energy level of the dopants and an energy level of the conduction band for a material of the n-type and being a difference in energy between an energy level of the valence band and an energy level of the dopants for a material of the p type, the method including a first step during which an electric voltage between the first contact and the second contact has a first value and the depletion zone has an initial dimension, the method including steps of:

illuminating the second portion with an electromagnetic radiation having a photon energy greater than the ionization energy of the dopants of the second portion and modifying the electric voltage from the first value to a second value while the second portion is illuminated, modifying the dimension of the depletion zone in response to the modification of the value of the electric voltage, stopping the illumination, modifying the voltage from the second value to the first value in the absence of illumination, the dimension of the depletion zone remaining unchanged, and illuminating the second portion with the radiation, the voltage having the first value, and modifying in response the dimension of the depletion zone to the initial dimension.

BRIEF INTRODUCTION OF THE DRAWINGS

Features and advantages of the invention will appear upon reading the following description, given only as a non-limiting example, and made in reference to the appended drawings, in which.

DETAILED DESCRIPTION

Figure 1:
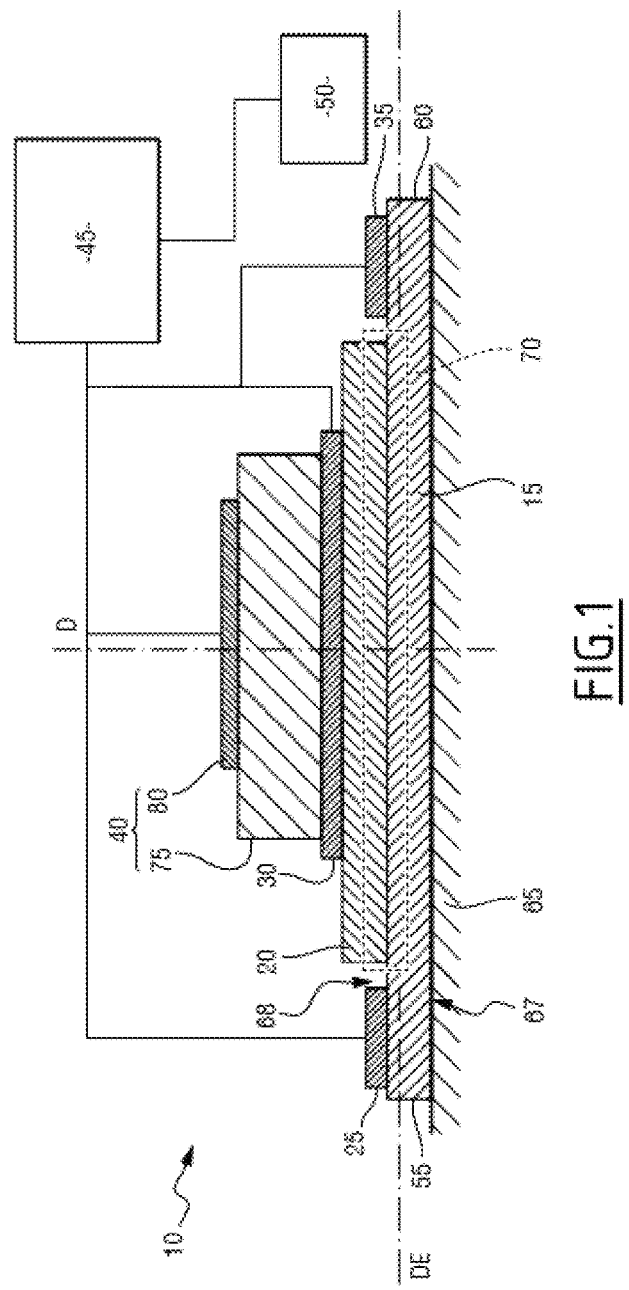
FIG. 1 is a diagram of an example of a device according to the invention.

A first example of an optoelectronic device 10 is shown in FIG. 1.

The device 10 is, for example, a device 10 out of a set of devices 10 forming an apparatus such as a memory, an implant, a power electronic device or a communication or encryption apparatus.

The optoelectronic device 10 includes a first portion 15, a second portion 20, a first contact 25, a second contact 30, a third contact 35, an emitter 40, a controller 45 and, optionally, a thermoregulator 50.

The first example of an optoelectronic device 10 is, for example, a transistor.

The first portion 15 is, for example, parallelepipedic.

The first portion 15 extends in a direction of extension DE between a first end 55 and a second end 60.

The first portion 15 has, for example, in a plane perpendicular to the direction of extension DE, a cross-section, the surface area of which is less than or equal to 0.1 square millimeters ($mm^2$).

The first portion 15 is, for example, a layer carried by a face perpendicular to a normal direction D of a substrate 65.

The first portion 15 has, for example, a thickness of between 10 nanometers (nm) and 10 micrometers (μm) in a first direction, in particular the normal direction D, perpendicular to the direction of extension DE, and/or a width, in a second direction perpendicular to the first direction and to the direction of extension DE, of between 1 μm and 1 centimeter (cm).

The first portion 15 is, for example, defined in the normal direction D by a first face 67 and a second face 68 of the first portion 15.

The first face 67 is in contact with the substrate 65.

The second face 68 is in contact with the second portion 20.

The first portion 15 is made of a first semiconductor material.

A semiconductor material is a material having a band gap value strictly greater than zero and less than or equal to 8 electronvolts (eV), in particular less than or equal to 6.5 eV.

The expression "band gap value" must be understood as being the value of the band gap between the valence band and the conduction band of the material.

The valence band is defined as being, among the energy bands that are authorized for the electrons in the material, the band that has the highest energy while being completely filled at a temperature less than or equal to 20 Kelvin (K).

A first energy level is defined for each valence band. The first energy level is the highest energy level of the valence band.

The conduction band is defined as being, among the energy bands that are authorized for the electrons in the material, the band that has the lowest energy while not being completely filled at a temperature less than or equal to 20 K.

A second energy level is defined for each conduction band. The second energy level is the lowest energy level of the conduction band.

Thus, each band gap value is measured between the first energy level and the second energy level of the material.

A semiconductor with a direct band gap constitutes an example of a semiconductor material. A material is considered to have a "direct band gap" when the minimum of the conduction band and the maximum of the valence band correspond to the same value of momentum of charge carriers. A material is considered to have an "indirect band gap" when the minimum of the conduction band and the maximum of the valence band correspond to different values of momentum of charge carriers.

Each semiconductor material is liable to be chosen, for example, from the set formed by the III-V semiconductors, in particular nitrides of Ill elements, II-VI semiconductors, or IV-IV semiconductors.

The III-V semiconductors include in particular InAs, GaAs, AlAs and their alloys, InP, GaP, AlP and their alloys, and the nitrides of Ill elements, which are AlN, GaN, InN and their alloys like AlGaN or InGaN.

The II-VI semiconductors include in particular CdTe, HgTe, CdSe, HgSe, and their alloys.

The IV-IV semiconductors include in particular certain forms of C carbon, including diamond, Si, Ge and their alloys, in particular SiC.

The first material has, for example, a band gap greater than or equal to 3 eV, in particular greater than or equal to 5 eV.

The first material is, for example, diamond.

Alternatively, the first material is, for example, SiC, GaN, AlN, BN, $Ga_2O_3$, $MgGa_2O_4$, $Al_2O_3$, $ZnSiN_2$, AlGaInN, $MgSiN_2$, or ZnO, or an alloy of several of these materials.

The first material has a doping of a first type.

The first type of doping is chosen from p-type doping and n-type doping. For example, the first type of doping is p-type doping.

Doping is defined as the presence, in a material, of impurities providing free charge carriers. The impurities are, for example, atoms of an element that is not naturally present in the material.

When the impurities increase the density of holes in the material, with respect to a non-doped material, the doping is of the p-type. For example, diamond is p-doped by adding atoms of boron (B).

When the impurities increase the density of free electrons in the material, with respect to the non-doped material, the doping is of the n type. For example, diamond is n-doped by adding atoms of nitrogen (N) or of phosphorus (P).

The first material is, for example, doped by insertion of boron atoms into the diamond.

The first material has, for example, a density of dopants greater than or equal to $10^{14}$ per cubic centimeter ($cm^{-3}$), particularly greater than or equal to $10^{17}$ $cm^3$, in particular equal to $2.10^{17}$ $cm^{-3}$. However, the density of dopants of the first portion is capable of varying.

The second portion 20 is made of a second semiconductor material.

In general, the second material is in particular identical to the first material, except for the doping.

The second material has a second type of doping, out of p-type doping and n-type doping, different than the first type of doping. For example, the second type of doping is n-type doping.

The second material is, for example, the same material as the first material except for the type of doping.

The second material is, for example, diamond.

An ionization energy is defined for the second material.

The ionization energy is, when the second material is n-doped, the difference in energy between the energy level corresponding to the dopants in the band gap and the bottom energy level of the conduction band.

When the second material is p-doped, the ionization energy is the difference in energy between the energy level corresponding to the dopants in the band gap and the top energy level of the valence band.

The ionization energy of the second material is greater than or equal to 0.4 eV, for example greater than or equal to 1 eV, in particular greater than or equal to 1.5 eV.

When the second material is diamond, the doping is, for example, doping with nitrogen (N) atoms, in which case the ionization energy is close to 1.7 eV.

According to another example, the doping is doping with phosphorus (P) atoms, in which case the ionization energy is close to 1.2 eV.

As will be clear below, the second portion 20 is electrically conductive, because of its doping, in certain circumstances, but not in others.

In general, this is the case for doped semiconductors, since the doping allows electric conduction when electrons of the valence band are captured by p dopants (and thus leave a mobile hole in the valence band) or when electrons of n dopants are captured by the conduction band (in which they are free to move).

However, for this, it is necessary for these electrons to acquire an energy equal to the difference in energy between the two states between which the electrons move. In practice, this energy is thermal energy in the uses of the prior art. However, as will be shown below, sources of energy other than only heat are possible.

The second portion 20 is in contact with the first portion 15.

The second portion 20 is, for example, a layer of second material carried by the second face 68 of the first portion 15.

In particular, the second portion 20 and the first portion 15 form a p/n junction.

A p/n junction is defined as being the interface between two portions of semiconductor material respectively having p-type doping and n-type doping.

The p/n junction includes in particular a depletion zone 70.

The depletion zone 70 is a zone of the first portion 15 and/or of the second portion 20 that is devoid of free charge carriers because of the recombination of the free carriers provided by the dopants of a first type with the free carriers provided by the dopants of another type, near the interface between the first portion 15 and the second portion 20.

The depletion zone 70 includes at least a part of the first portion 15. The depletion zone 70 further includes a part of the second portion 20.

In a manner known per se, the extension of the depletion zone 70 depends on the electric potential in each point of the first portion 15 and of the second portion 20.

The first contact 25 is made of an electrically conductive material or of an assembly of such materials.

The first contact 25 is electrically connected to the first portion 15.

For example, the first contact 25 is formed by one or more layer(s) of metal carried by a face (in particular by the second face 68) of the first portion 15, for example by a stack of layers of titanium, platinum and gold.

In particular, the first contact 25 is electrically connected to the first end 55.

Optionally, a portion of the first material having a doping of the first type and a larger concentration of free carriers than the first portion 15 is interposed between the first contact 25 and the first end 55. This portion has, for example, a thickness (measured between the first contact 25 and the first end 55) of between 50 nanometers and 300 nanometers (nm).

When the optoelectronic device 10 is a transistor, the first contact 25 is, for example, a drain or a source of the transistor, in particular a drain.

The second contact 30 is electrically connected to the second portion 20.

For example, the second contact 30 is formed by one or more layer(s) of metal carried by a face of the second portion 20, for example by a stack of layers of titanium, platinum and gold.

Alternatively, the second contact 30 is made of a semiconductor material having the second type of doping, for example of diamond doped with boron.

The second contact 30 is, for example, carried by a face of the second portion 20 that defines the second portion 20 in the normal direction D.

The second portion 20 is interposed between the second contact 30 and the first portion 15.

When the optoelectronic device 10 is a transistor, the second contact 30 is, for example, a gate of the transistor.

The second contact 30 is, in particular, configured so that when a voltage V1 is imposed between the first contact 25 and the second contact 30, a dimension of the depletion zone 70 depends on the value of the voltage V1.

"Dimension" means a measurement of the extension of the depletion zone 70, for example a volume of the depletion zone 70 or a distance between a given point of the p/n junction and the farthest point of the depletion zone 70.

For example, the second contact 30 and the first contact 25, together, are configured so that a distance between the second face 68 of the first portion 15 and the point of the depletion zone 70 farthest from the second face 68 in the normal direction D depends on the value of the voltage V1 between the first contact 25 and the second contact 30.

Such an effect, known per se, is called "field effect" and is used in certain transistors, like in particular the aforementioned JFETs.

In particular, the second contact 30 and the first contact 25, together, are configured so that when the voltage V1 between these two contacts 25, 30 is equal to a predefined value, hereinafter called "cutoff value VC", the depletion zone 70 blocks the passage of current through the first portion 15 between the first contact 25 and the third contact 35.

For example, when the voltage V1 has its cutoff value VC, the depletion zone 70 extends, in at least one section of the first portion 15, from the second face 68 to the first face 67.

The cutoff value VC is, for example, greater than or equal, in absolute value, to 10 volts (V), for example equal to 40V. The cutoff value VC is, for example, between −100 V and +100 V.

This type of operation is in particular that of a transistor of the aforementioned JFET type.

For this, the second contact 30 and the first contact 25 are in particular, as described above, carried by different faces of the assembly formed by the first portion 15 and the second portion 20.

The third contact 35 is made of an electrically conductive material or of an assembly of such materials.

The third contact 35 is electrically connected to the first portion 15.

For example, the third contact 35 is formed by one or more layer(s) of metal carried by a face of the first portion 15, for example by a stack of layers of titanium, platinum and gold.

In particular, the third contact 35 is electrically connected to the second end 60.

Optionally, a portion of the first material having a doping of the first type and a greater concentration of free carriers than the first portion 15 is interposed between the third contact 35 and the second end 60. This portion has, for example, a thickness (measured between the third contact 35 and the second end 60) of between 100 nm and 300 nm.

When the optoelectronic device 10 is a transistor, the third contact 35 is, for example, a drain or a source of the transistor, in particular a source.

The emitter 40 is configured to generate an electromagnetic radiation and to illuminate the second portion 20 with the radiation.

The emitter 40 includes, for example, a light-emitting diode 75 and at least one fourth electric contact 80.

The emitter 40 is, for example, carried by the same face of the second portion 20 as the second contact 30, or carried by the second contact 30 itself, which in this case is partly transparent or totally transparent to the radiation.

Alternatively, the emitter 40 is not in contact with the rest of the device 10, for example if the emitter 40 is shared by several devices 10, or if the radiation generated by the emitter 40 is focused on the second portion 20 by a focusing device such as a lens, or brought to the second portion 20 by an optical conductor such as an optical fibre.

In general, the emitter 40 can take numerous forms, for example a light source shared by several devices 10 and including, for each device 10, an element suitable for preventing the radiation from illuminating the corresponding device 10 if necessary, for example an element made of liquid crystal.

The emitter 40 is, in particular, configured to only illuminate a single device 10, if several devices 10 are present. For example, opaque barriers are disposed between neighboring devices 10.

The light-emitting diode 75 is configured to generate the radiation when a voltage is imposed between two faces of the diode 75, for example between the fourth contact 80 and the second contact 30 when the emitter 40 is carried by the second contact 30.

The light-emitting diode 75 is, for example, a planar diode formed by a stack of layers superimposed in the normal direction D.

Alternatively, the light-emitting diode 75 is formed by a set of nanostructures each extending in the normal direction D, each nanostructure being, for example, a nanowire or a nanocolumn. In this case, each nanostructure has, for example, a light-emitting diode structure, in particular a base having the second type of doping, a top having the first type and an intermediate portion, interposed between the base and the top, and configured to generate the radiation.

The radiation has a photon energy. The photon energy is defined as being the energy of a photon of the radiation.

In particular, the photon energy is defined as being the energy that the largest number of photons of the radiation has, in other words the energy corresponding to the top of a peak of a curve representing the light intensity of the radiation according to the photon energy.

The photon energy of the radiation is greater than or equal to the ionization energy of the second portion.

In particular, the photon energy is strictly less than the value of the band gap of the second material.

The photon energy is, for example, between 1.7 eV and 3.3 eV, in particular between 2.6 eV and 3.3 eV. In this case, the radiation is blue or violet radiation.

The radiation propagates, for example, in the normal direction D from the light-emitting diode 75 in the direction of the substrate 65.

The radiation has, for example, a photon power P between 1 milliwatt per square centimeter and 10 watts per square centimeter, for example equal to 11 milliwatts per square centimeter.

The controller 45 is configured to control the application of a voltage V1 between the first contact 25 and the second contact 30, of a voltage V2 between the first contact 25 and the third contact 35, and/or of a voltage between the second contact 30 and the fourth contact 80. In particular, the controller 45 is configured to control the generation of the radiation by the emitter 40, and the illumination of the second portion 20 with the radiation.

The controller 45, and/or the thermoregulator 50, are for example shared by several devices 10. According to possible embodiments, a single controller 45 is for example suitable for controlling each device 10, in particular for controlling the voltages V1 and V2 of each of the devices, as well as the various emitters 40.

The thermoregulator 50, which is optional, is configured to maintain at a set temperature at least the second portion 20, for example all of the device 10.

In particular, the thermoregulator 50 is configured to maintain the second portion 20 at a temperature such that the thermal energy of the free carriers in the second portion 20 is less than or equal to one tenth of the ionization energy of the second portion 20.

The thermal energy is proportional to the product of the Boltzmann constant k and of the temperature in kelvin. The Boltzmann constant k is equal to $1.380649 \times 10^{-23}$ joules per kelvin.

For example, the thermoregulator 50 is provided to maintain the temperature at a value such that the product of the Boltzmann constant and of the temperature is less than or equal to one tenth of the ionization energy.

The operation of the first example will now be described, in reference to FIGS. 2 and 3.

Figure 2:
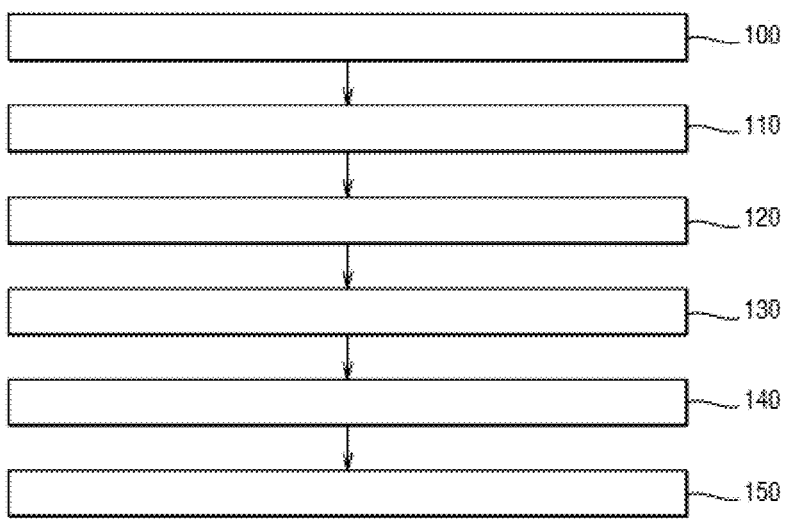
FIG. 2 is a flowchart of the steps of a method implemented by the device of FIG. 1.

FIG. 2 shows a flowchart of the steps of a method for operating the electronic device 10.

Figure 3:
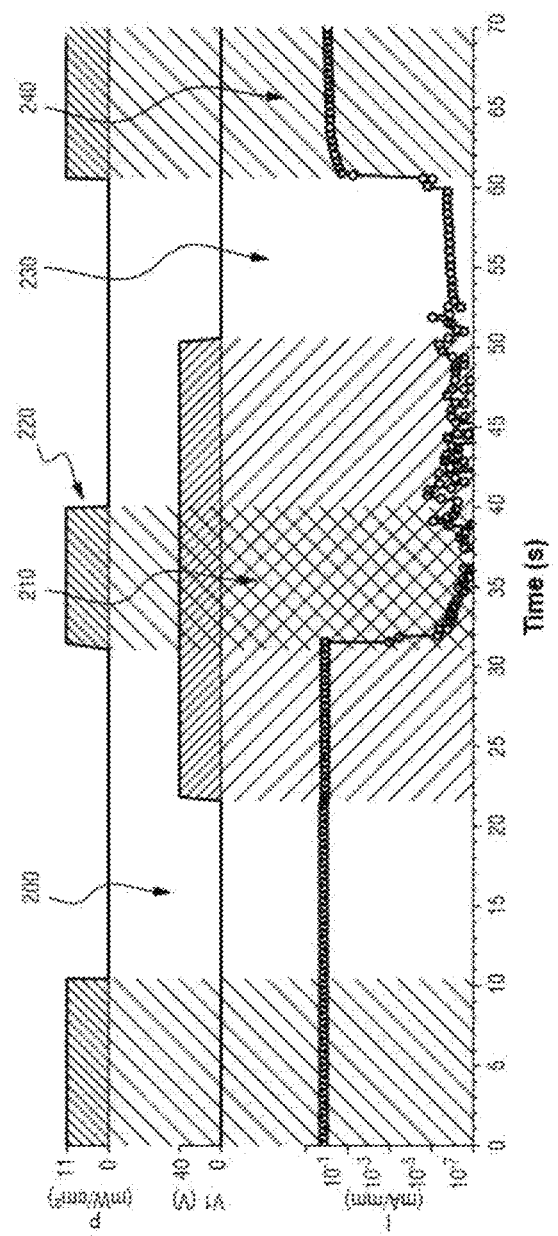
FIG. 3 is a set of graphs showing the change in certain parameters of the device during the method of FIG. 2.

FIG. 3 shows, during the implementation of the method, the change in the values of the photon power P of the radiation, of the voltage V1 between the contacts 25 and 30, and of the current density I of a current circulating between the contacts 25 and 30.

The method includes an initial step 100, a first illumination step 110, a first modification step 120, a stoppage step 130, a second modification step 140 and a second illumination step 150.

During the initial step 100, the voltage V1 between the first contact 25 and the second contact 30 is equal to an initial value, the latter being, for example, zero volts. Moreover, the radiation is not emitted by the emitter 40.

During the initial step 100, the depletion zone 70 has a minimum dimension. For example, the initial step 100 was preceded by a step in which the second portion 20 was illuminated by the radiation while the voltage V1 was equal to the initial value, as will appear below.

The minimum dimension of the depletion zone 70 is its dimension when the voltage V1 has its initial value, and the second portion 20 is electrically conductive, for example when the temperature of the second portion 20 is sufficient for the concentration of free carriers in the second portion 20 to be greater than or equal to $10^{10}$ cm$^{-3}$ in the absence of radiation, or when, below this temperature, the second portion 20 is illuminated by the radiation.

The depletion zone 70 is symbolically shown in its minimum dimension in FIG. 1.

When the depletion zone 70 has its minimum dimension, the depletion zone 70 allows the passage of an electric current through the first portion 15 between the first contact 25 and the third contact 35.

Thus, during the initial step 100, the transistor 10 is in an "on" state, since the first portion 15 is conductive for a current circulating between the source 35 and the drain 25 or vice versa.

In the method example described here, an electric voltage V2 of between −40 V and 40 V is applied by the controller 45 between the first contact 25 and the third contact 35. An electric current thus circulates between the first contact 25 and the third contact 35.

The configuration of the device 10 during the initial step 100 is indicated by an arrow 200 in FIG. 3. The current density I is, in particular, equal to 0.1 milliamperes per millimeter (mA/mm), however this current density can vary according to the voltage V2.

During the first illumination step 110, the second portion 20 is illuminated with the radiation.

For example, the controller 45 electrically powers the emitter 40 so as to cause the generation of the radiation by the emitter 40.

During the first illumination step 110, the voltage V1 is modified, by the controller 45, from the initial value to the cutoff value VC.

In particular, during the first step 110, there is at least one time interval during which the voltage V1 has the cutoff value VC and the second portion 20 is illuminated with the radiation. This time interval has a duration greater than or equal to 1 nanosecond (ns), for example between 10 ns and 100 microseconds (μs).

For example, the voltage V1 is maintained at the cutoff value VC before the first portion 15 is illuminated with the radiation. Alternatively, the illumination starts before the modification of the value of the voltage V1.

It should be noted that, in the case in which the modification of the voltage V1 takes place before the illumination starts, the extension of the depletion zone 70 does not vary before the illumination starts.

Indeed, the size of the depletion zone depends on the capacity of the free carriers of both types (holes and free electrons) to move in the p/n junction to recombine, which results in a depletion zone 70 devoid of free carriers in a significant quantity.

In the present case, since the temperature of the second portion 20 is such that the thermal energy available for the carriers is clearly less than the ionization energy, very few free carriers are naturally present there since very few dopants can be thermally ionized and thus release their carriers. Thus, even though the field effect caused by the two contacts 25, 30 and the voltage V1 between them should tend to increase the dimension of the depletion zone 70, this does not actually occur.

The first modification step 120 takes place during the time interval during which the second portion 20 is illuminated and the voltage V1 has the cutoff value VC.

This time interval is visible in FIG. 3 and indicated by an arrow 210.

Since the radiation has a photon energy greater than or equal to the ionization energy, dopants are ionized by absorbing a part of the radiation and thus release free carriers in the second portion 20.

Thus, the illumination with the radiation, as well as the presence of the second voltage V1 at its cutoff value VC, lead to the modification of the extension of the depletion zone 70.

In particular, at least one of the dimensions of the depletion zone 70 increases until it cuts off the passage of current between the first contact 25 and the third contact 35. The transistor is thus off. Consequently, the current density I measured greatly decreases with respect to the initial step, and is approximately $10^{-7}$ mA/mm.

In particular, the depletion zone extends from the second face 68 to the first face 67 under the effect of the voltage V1 and of the illumination.

During the stoppage step 130, the illumination is stopped. For example, the controller 45 stops electrically powering the emitter 40.

The stoppage of the illumination makes the second portion 20 once again electrically insulating, since its dopants can now only count on the thermal energy, which is insufficient, to be ionized.

The stoppage of the illumination is indicated by the arrow 220 in FIG. 3.

During the second modification step 140, the voltage V1 is modified from its cutoff value to its initial value.

Since the second portion 20 is electrically insulating in the absence of illumination, the depletion zone 70 remains at its maximum dimension and thus prevents the passage of the current between the first contact 25 and the third contact 35.

This is visible in the zone indicated by the arrow 230 in FIG. 3, where although, like in the initial step 100, the voltage V1 is null and no illumination is present, the current density I measured remains approximately 6 orders of magnitude less than that which it is in the initial step 100 (see arrow 200).

During the second illumination step 150, the second portion 20 is illuminated with the radiation, the voltage V1 remaining at its initial value.

The ionization of the dopants of the second portion 20 by the radiation thus leads to the modification of the dimension of the depletion zone 70.

In particular, the dimension of the depletion zone 70 goes back to its initial value (i.e. the value during the initial step 100). Thus, the current can once again circulate between the first contact 25 and the third contact 35 under the effect of the voltage V2. This appears at the arrow 240 in FIG. 3, the current density I going back to its initial level.

The steps 100 to 150 are, for example, iterated as much as necessary during the operation of the device 10.

Via the invention, the dimension of the depletion zone 70 is only modified when the second portion 20 is illuminated with the radiation, independently of the value of the voltage V1.

Thus, the device 10 switches between its two states (corresponding to the two dimensions of the depletion zone 70) in a non-volatile manner.

In particular, the inventors were able to measure that, in the absence of illumination, the transistor remains in its off state, even with a voltage V1 equal to zero, for 48 hours at 297 K, the beginning of the illumination leading to an increase of more than 4 orders of magnitude of the current. At 373 K, a difference of more than three orders of magnitude is observed when the second portion 20 is illuminated after an hour.

In particular, the device 10 remains in each of its states even in the absence of an electric voltage (i.e. when V1 is equal to zero). The value of the voltage V1 only has, in fact, any importance when the second portion 20 is illuminated.

As a result, the device 10 only requires an electric power supply (besides for example an optional voltage V2) when it is desired to switch the device from one state to the other, since it is then necessary at least to generate the radiation and, if necessary, apply the voltage V1, with its cutoff value VC, between the contacts 25 and 30.

Thus, the energy consumption of the device 10 is reduced.

It should be noted that the invention lies in particular in the choice of a combination between the operating temperature of the device 10 and the ionization energy of the second portion 20, which prevents the second portion 20 from being conductive at this temperature under the effect of the thermal energy alone. In other words, the doping of the second portion is too deep to be functional in the absence of radiation at the desired operating temperature. Such doping would thus be considered as useless and inefficient for a person skilled in the art in devices of the prior art devoid of an emitter.

If the photon energy is strictly less than the value of the band gap of the second portion 20, only the dopants absorb the radiation, which can thus deeply illuminate the second portion since it is little absorbed by the latter. The intensity of the radiation emitted is thus low and the energy consumption reduced.

The presence of a thermoregulator 50 allows to maintain the second portion 20 at a temperature at which the dopants are only slightly thermally ionized, and thus to use a wide range of possible semiconductor materials.

When the ionization energy is greater than or equal to 0.4 eV, the device 10 is capable of not having a thermoregulator 50, since, at ambient temperature (approximately 20–30° C.), the dopants of the second portion 20 are only very slightly ionized.

Diamond in particular has a very broad band gap, and thus allows the selection of dopants having high ionization energies, in particular nitrogen, the ionization energy of which is 1.7 eV, or phosphorus, the ionization energy of which is 1.2 eV.

Such devices 10, in particular such transistors, are advantageously usable for example in memories, the information stored in state-memory for example in the form of an on or off state of the transistor (for example, an on transistor indicates a value "0" and an off transistor a state "1", or vice versa).

The low consumption of the transistors 10 makes them particularly adapted to forming a part of a module, for example of a memory or of a multiplexer, of an implant intended to be implanted in the body of a patient or of an animal, for example in the brain.

For example, using the transistors 10 to create a time multiplexer connecting various electrodes to an information processing module, this multiplexer being provided to successively connect to the information processing module the various electrodes so as to allow a multiplexing of the signals exchanged between the electrodes and the processing module.

In particular, diamond is a biocompatible material and would thus be particularly adapted to such an implantation, since a placement of the device 10 in contact with bodily fluids for example would thus be damaging neither to the patient nor to the operation of the device 10.

Although an example of the device 10 in the form of a transistor 10 is shown in the drawings and described above, it will be clear to a person skilled in the art that the invention is capable of being applied to other types of devices 10. In particular, the modification of the extension of the depletion zone is not necessarily used to allow or block the passage of an electric current.

For example, the device 10 is a single-photon generator and includes, in the first portion 15, an XV center.

These defects are formed by an atom (X) substituted for a carbon atom in the crystalline lattice and coupled with an adjacent vacancy (V for vacancy). X is the generic symbol of the atom substituted for the carbon atom (for example N, Si, Sn, etc.).

Such centers can have several states according to their charge. In particular, their state can vary according to the local Fermi level, and thus be modified according to whether or not the XV center is located in the depletion zone 70.

Via the excitation of an XV center, it is possible to obtain the emission of single photons, in particular, which have a use for quantum communication or cryptography.

The NV center is, for example, provided to be optically excited by sources of visible lights in order to carry out a transition from the ground state to the excited state. The intensity of the optical signals of luminescence of the NV$^-$ centers is sensitive to outside disturbances such as the temperature, the deformations of the crystal and the magnetic and electric fields. The intensity of the luminescence can be used quantitatively to measure one of these physical values at ambient temperature. A NV$^-$ center can be obtained from a NV$^0$ centre by modifying the Fermi level, which is carried out in a non-volatile manner via this invention.

In the case of the device 10, the contacts 25 and 30 are configured so that, in the presence of the radiation 20, when the voltage V1 has its initial value, the XV center is located outside the depletion zone 70, and the XV center is included in the depletion zone 70 when the voltage V1 has the cutoff value VC.

Thus, the state of the XV center, in particular its charge state, is modified by controlling the voltage V1 when the radiation illuminates the second portion 20, and is kept unchanged in the absence of the radiation, regardless of the value of the voltage V1.

Like in the case of the transistors, this results in a reduction in the energy consumption with respect to single-photon generators of the prior art.

It should be noted that the single-photon generators of this type are, for example, devoid of a third contact 35.

According to another possible alternative, the device 10 is a transistor of the MOSFET type, in particular a MOSFET operating via inversion, the first portion 15 being a portion of the substrate carrying the transistor. Thus, the extension of the depletion zone allows to polarize the substrate in a non-volatile manner and thus to modify the threshold voltage, for which a conduction channel between the drain and the source appears.

It should also be noted that the geometry of the device 10 is capable of varying. For example, a plurality of second portions 20 are capable of being present, these second portions each being connected to a corresponding second contact 30, the second contacts 30 being for example electrically connected to each other so as to have the same electric potential. In this case, the first portion 15 is, for example, interposed between several second portions 20, so that the depletion zones 70 of the second portions 20, when the voltage V1 has the cutoff value VC, extend towards each other until they merge and thus form, over an entire section of the first portion 15, a barrier to the passage of the current between the contacts 25 and 35.

According to another alternative, the second portion 20 is a portion or the entirety of a substrate carrying the first portion 15, the contact 30 thus being, for example, disposed on a face of the substrate opposite to the face carrying the first portion 15.

The invention claimed is:

1. An optoelectronic device including a first portion, a second portion, a first contact and a second contact, the first portion being made of a first semiconductor material having a first type of doping out of n-type doping and p-type doping, the second portion being made of a second semiconductor material having a second type of doping out of n-type doping and p-type doping, the second type of doping being different than the first type of doping, the first portion and the second portion being in contact with one another and forming a p/n junction including a depletion zone in the first portion, the first contact being electrically connected to the first portion, the second contact being electrically connected to the second portion, the first contact and the second contact being configured so that when an electric voltage is applied between the first contact and the second contact, a dimension of the depletion zone depends on a value of the electric voltage, an ionization energy being defined for dopants of the second portion, the ionization energy being a difference in energy between an energy level of the dopants and an energy level of the conduction band for a material of the n type and being a difference in energy between an energy level of the valence band and an energy level of the dopants for a material of the p type, the optoelectronic device further including an emitter configured to generate an electromagnetic radiation having a photon energy greater than or equal to the ionization energy of the dopants of the second portion and to illuminate the second portion with the radiation.

2. The optoelectronic device according to claim 1, wherein the photon energy is strictly less than a band gap value of the second portion, the band gap value being a difference in energy between a conduction band and a valence band of the second portion.

3. The optoelectronic device according to claim 1, further including a thermoregulator configured to maintain a temperature of the second portion at a value such that the thermal energy of the carriers in the second portion is less than or equal to one tenth of the ionization energy.

4. The optoelectronic device according to claim 1, further including a controller configured to control the generation of the radiation by the emitter and to modify a value of voltage between the first contact and the second contact while the second portion is illuminated with the radiation.

5. The optoelectronic device according to claim 1, the optoelectronic device being a transistor and further including a third electric contact, the third electric contact being electrically connected to the first portion, the first contact being a source, the second contact being a gate and the third contact being a drain of the transistor, the first contact and the second contact being configured so that for a given value of the voltage between the first contact and the second contact, the depletion zone prevents the passage of charge carriers, in the first portion, between the first contact and the third contact.

6. The optoelectronic device according to claim 1, wherein the ionization energy is greater than or equal to 0.4 electronvolts.

7. The optoelectronic device according to claim 6, wherein the second material is diamond.

8. The optoelectronic device according to claim 7, wherein the dopants of the second material are nitrogen atoms.

9. The optoelectronic device according to claim 7, wherein the dopants of the second material are phosphorus atoms.

10. The optoelectronic device according to claim 7, comprising at least one NV center in the first portion, the first contact and the second contact being configured so that for a first value of the voltage between the first contact and the second contact, the depletion zone includes the NV center and for a second value of the voltage, the depletion zone does not include the NV center.

11. A singlephoton generator including an optoelectronic device according to claim 10.

12. A memory including at least one transistor according to claim 5, the memory being configured to store at least one piece of information in the form of an on or off state of the transistor.

13. A time multiplexer including at least one transistor according to claim 5.

14. An implant suitable for being implanted in a human or animal body, including the multiplexer according to claim 13 and/or at least one transistor according to claim 5.

15. A method for operating an optoelectronic device including a first portion, a second portion, a first contact and a second contact, the first portion being made of a first semiconductor material having a first type of doping out of n-type doping and p-type doping, the second portion being made of a second semiconductor material having a second type of doping out of n-type doping and p-type doping, the second type of doping being different than the first type of doping, the first portion and the second portion being in contact with one another and forming a p/n junction including a depletion zone in the first portion, the first contact being electrically connected to the first portion, the second contact being electrically connected to the second portion, an ionization energy being defined for dopants of the second portion, the ionization energy being a difference in energy between an energy level of the dopants and an energy level of the conduction band for a material of the n type and being a difference in energy between an energy level of the valence band and an energy level of the dopants for a material of the p type, the method including a first step during which an electric voltage between the first contact and the second contact has a first value and the depletion zone has an initial dimension, the method including steps of:
    illuminating the second portion with an electromagnetic radiation having a photon energy greater than the ionization energy of the dopants of the second portion and modifying the electric voltage from the first value to a second value while the second portion is illuminated,
    modifying the dimension of the depletion zone in response to the modification of the value of the electric voltage ,
    stopping the illumination,
    modifying the voltage from the second value to the first value in the absence of illumination, the dimension of the depletion zone remaining unchanged, and
    illuminating the second portion with the radiation, the voltage having the first value, and modifying in response the dimension of the depletion zone to the initial dimension.

* * * * *